United States Patent
Militzer et al.

(10) Patent No.: US 12,392,041 B2
(45) Date of Patent: Aug. 19, 2025

(54) REFRACTORY CARBIDE MULTILAYER

(71) Applicant: SGL CARBON SE, Wiesbaden (DE)

(72) Inventors: Christian Militzer, Meitingen (DE); Charles Wijayawardhana, Meitingen (DE); Urban Forsberg, Sturefors (SE); Henrik Pedersen, Stigtomta (SE)

(73) Assignee: SGL CARBON SE, Wiesbaden (DE)

( * ) Notice: Subject to any disclaimer, the term of this patent is extended or adjusted under 35 U.S.C. 154(b) by 0 days.

(21) Appl. No.: 18/040,549

(22) PCT Filed: Aug. 5, 2021

(86) PCT No.: PCT/EP2021/071918
§ 371 (c)(1),
(2) Date: Feb. 3, 2023

(87) PCT Pub. No.: WO2022/029251
PCT Pub. Date: Feb. 10, 2022

(65) Prior Publication Data
US 2023/0304162 A1    Sep. 28, 2023

(30) Foreign Application Priority Data
Aug. 6, 2020 (DE) .............. 10 2020 209 945.6

(51) Int. Cl.
*C23C 28/04* (2006.01)
*B32B 18/00* (2006.01)
(Continued)

(52) U.S. Cl.
CPC ............ *C23C 28/042* (2013.01); *B32B 18/00* (2013.01); *C01B 32/914* (2017.08);
(Continued)

(58) Field of Classification Search
None
See application file for complete search history.

(56) References Cited

U.S. PATENT DOCUMENTS 6,071,343 A * 6/2000 Inaba ............... C23C 16/325
                                                    118/728
2012/0202054 A1   8/2012  Endler et al.
2016/0040299 A1   2/2016  Allemand et al.

FOREIGN PATENT DOCUMENTS

EP   3514128 A1      7/2019
JP   2000073171 A *  3/2000
WO   0127361 A1      4/2001

OTHER PUBLICATIONS

International Search Report issued on Dec. 8, 2021, in corresponding International Patent Application No. PCT/EP2021/071918, 4 pages.

(Continued)

*Primary Examiner* — David Sample
(74) *Attorney, Agent, or Firm* — Maier & Maier, PLLC

(57) ABSTRACT

A refractory carbide multilayer including a first layer, a second layer and a third layer. The first layer has an average thickness of at least 25 nm and contains at least one refractory carbide, the second layer has an average thickness of at least 25 nm and contains at least one refractory carbide, the third layer has an average thickness of at least 25 nm and contains at least one refractory carbide, and the first layer has a larger mean linear intercept section grain size than the second layer.

12 Claims, 9 Drawing Sheets

(51) Int. Cl.
  *C01B 32/914* (2017.01)
  *C04B 41/00* (2006.01)
  *C04B 41/52* (2006.01)
  *C04B 41/89* (2006.01)
  *C23C 16/32* (2006.01)

(52) U.S. Cl.
  CPC .......... *C04B 41/009* (2013.01); *C04B 41/526* (2013.01); *C04B 41/89* (2013.01); *C23C 16/325* (2013.01)

(56) References Cited

OTHER PUBLICATIONS

Kim J.I. et al, "Design of a C/SiC functionally graded coating for the oxidation protection of C/C composites", Carbon, vol. 43, No. 8, Jul. 1, 2005 (Jul. 1, 2005), pp. 1749-1757, XP055866875.

* cited by examiner

REFRACTORY CARBIDE MULTILAYER

FIELD

The invention relates to a refractory carbide multilayer, to a device comprising the multilayer, to a CVD method for preparing the multilayer and to the use of the multilayer.

BACKGROUND

J. Lòpez-Vidrier et al. (Materials Science and Engineering B 178 (2013) p. 639-644) describe silicon-rich silicon carbide (SRC) layers properly separated by SiC barrier layers. Crystalline Si or fused silica was used as a substrate. The multilayers were deposited by plasma enhanced chemical vapor deposition (PECVD) using $SiH_4$, $CH_4$ and $H_2$ as gas precursors. Each SiC barrier layer had a thickness of 3 nm, SRC layer thickness was either 2, 3, or 4 nm. A 20 nm buffer layer of SiC was also deposited between the substrate and the multilayers. $SiH_4$ flow rate was varied such that SRC layers had excess Si concentrations of 20, 30, and 50 at %, respectively.

EP 0 935 013 A1 describes a CVD-formed SiC product which possesses low transparency for light in specific wavelength ranges. The CVD-formed SiC product is made on a substrate by first depositing a SiC coating on the substrate via a CVD method, then removing the substrate, and having at least one SiC layer with different grain characteristics formed either at its surface or within the structure of the formed SiC product. This causes scattering, refraction, reflection, and the like.

WO 2019/182306 A1 describes a graphite coating method which comprises: a) supporting a solid silicon on a porous carrier; b) preparing a first silicon carbide coating layer by loading a graphite base material for coating in a vacuum chamber and a porous carrier on which the solid silicon is loaded, and then performing heat treatment at 1,400 to 2,000° C.; and c) depositing a second silicon carbide coating layer on the first silicon carbide coating layer through chemical vapor deposition; and a method for coating a graphite base material using a hybrid coating method. The method searches to avoid cracks that occur in conventional SiC coating during the cooling process after the deposition.

EP 3 514 130 A1 describes silicon carbide coated bodies (or articles), comprising I-A) a porous graphite substrate and II-A) at least two SiC coating layers of different density; and optionally III-A) an interfacial layer located between the graphite substrate and the SiC coating layers comprising the porous graphite and pores filled with SiC in the form of tendrils of at least 50 µm length, extending from the at least one SiC coating layer into the porous graphite substrate. This document further describes that in such multilayer SiC coated articles the at least two SiC coating layer(s) II-A) can be characterized by different crystal sizes.

U.S. Pat. No. 10,294,163 B2 relates to a SiC-coated carbon composite material comprising: a graphite base material; and a CVD-SiC coating covering the graphite base material. A SiC-infiltrated layer extends from the CVD-SiC coating and is included in the periphery of the core part. The SiC-infiltrated layer is constituted of a plurality of regions arranged such that Si content becomes smaller stepwise in an order from a first surface on the CVD-SiC coating side toward a second surface on the graphite base material side.

While WO 2019/182306 A1, EP 3 514 130 A1 and U.S. Pat. No. 10,294,163 B2 are focused on providing a better anchoring of the SiC coating on the graphite base material, little attention has so far been paid to improving the integrity of the carbide coating as such. Coating of substrates with ceramics via CVD is a common method for increasing the lifetime of a graphite base material, especially when it is used in high-temperature and corrosive/oxidative environments. Nevertheless, the ceramics are subject to degradation. The degradation paths include for example microcracks in the film which over time propagate into the substrate thus causing the substrate to be exposed to the harsh chemicals which often cause failure through etching and physical disintegration of the substrate prematurely. In particular refractory carbide coatings of graphite are prone to such failures. The use of an interlayer between carbide and graphite, as already suggested in the prior art, can reduce these problems only to a certain extend.

The problem underlying the present invention is the provision of a component for high temperature applications which can be used for a long time under conditions that involve mechanical (also possibly as result of temperature gradients) stress and exposure to hot etching gas and which is obtainable very easily with precisely controlled emissivity.

The inventors have discovered that engineering the structure of a refractory carbide coating itself offers a solution to this problem.

SUMMARY

The problem is solved by a refractory carbide multilayer comprising a first layer, a second layer and a third layer, wherein
 the first layer has an average thickness of at least 25 nm and contains at least one refractory carbide,
 the second layer has an average thickness of at least 25 nm and contains at least one refractory carbide,
 the third layer has an average thickness of at least 25 nm and contains at least one refractory carbide, and
 the first layer has a larger mean linear intercept section grain size than the second layer.

The multilayer can be a free-standing multilayer or part of a multilayer on a surface of a part of a device. A free-standing multilayer does not comprise a substrate. None of the two main surfaces of the free-standing multilayer is attached to a substrate. The invention thus further relates to a device for high temperature applications, wherein the device comprises a multilayer of the invention on a surface of a material of the device. High temperature as mentioned here typically refers to temperatures in a range from 200 to 4000° C., preferably 300 to 3000° C., e.g. 400 to 2500° C.

The material of the device is not limited. Every material that is stable at the high temperature of the high temperature application is suitable as a material of the device. Preferably, the material of the device comprises graphite or elemental silicon. The material of the device can, for example, be a graphite material, a carbon fiber reinforced material, or elemental silicon. The elemental silicon preferably is in the form of a wafer, e.g., as used in semiconductor industry. The material can have the shape of a support for semiconductor applications. It is well known in the art that such supports (wafer carriers) for semiconductor applications often have the shape of a disk or of a barrel with slanted side walls wherein both with one or more recesses for placing semiconductor substrates such as silicon-based wafers to be treated on the support, e.g. in epitaxy reactors or MOCVD reactors where such supports are routinely used for growing layers on wafers, or plasma etch reactors such as focused rings, or RTP reactors, i.e. RTP rings. However, the multilayer invention on the surface of a material of the device does not exclude another layer to be present between the graphite material and the multilayer. Such other layer would also form a material of the device.

The component referred to herein can therefore be the multilayer as such or the device. The word "multilayer" herein refers to the multilayer irrespective of whether it is part of the device or not. It is explicitly mentioned, whenever specific multilayer features or properties are addressed that are different for the free-standing multilayer on the one hand, and the multilayer of the device, on the other hand.

Refractory carbides are well known to skilled persons in the technical fields of surface coatings in general or chemical vapor deposition (CVD). Refractory carbides contain a non-carbon carbide-component and carbon. In silicon carbide, for example, the non-carbon carbide-component is silicon. The invention is not limited to a specific refractory carbide and certain refractory carbides may be preferred, depending on the specific application for which the multilayer of the invention is made. A refractory carbide contained in one layer among the first, second, third (and if available in any further) layer may be the same or different from a refractory carbide contained in any other layer among the first, second, third (and if available in any further) layer.

A refractory carbide contained in one layer is considered "the same" as a refractory carbide contained in any other layer if both refractory carbides contain the same non-carbon carbide-component (e.g. silicon). The layers may nevertheless differ, for example, with regard to mean linear intercept section grain size, porosity or content of non-carbide constituents.

A refractory carbide contained in one layer is considered "different" from a refractory carbide contained in any other layer if both refractory carbides contain different non-carbon carbide-component.

Preferably, at least one refractory carbide of at least one of the layers comprises a silicon carbide, tantalum carbide, niobium carbide, hafnium carbide, tungsten carbide, boron carbide, tantalum niobium carbide, tantalum hafnium carbide, or a niobium hafnium carbide.

More preferably, the first, second and third layer each contain the same refractory carbide, selected from silicon carbide, tantalum carbide, niobium carbide, hafnium carbide, tungsten carbide, boron carbide, tantalum niobium carbide, tantalum hafnium carbide, or a niobium hafnium carbide; in particular selected from silicon carbide, tantalum carbide, niobium carbide, hafnium carbide. Most preferably, the first, second and third layer each contain silicon carbide.

Independent of the specific context, the term "refractory carbide" as used herein preferably refers to "silicon carbide". Although specific effects were shown herein in particular for silicon carbide, it is reasonable to assume that same or similar effects are also observed for other refractory carbides, as the growth of these refractory carbides in CVD follows same or similar physical principles as shown in the examples.

According to the invention, the refractory carbide multilayer comprises a first layer, a second layer and a third layer. Each of these layers contains a refractory carbide. The number of layers can be recognized very easily from SEM images, as can be seen from various figures herein. The number of refractory carbide containing layers can be much larger than three. The multilayer can comprise, for example, 3 to 1000 refractory carbide containing layers, 3 to 100 refractory carbide containing layers, e.g. 4 to 50 refractory carbide containing layer. The number of refractory carbide containing layers can preferably be 3 to 12, e.g. 3 to 10 (or in particular 4 to 12, e.g. 4 to 10).

The invention does not exclude other layers, i.e. layers that do not contain a refractory carbide. The multilayer can, for example, comprise one carbon layer or multiple carbon layers. "Carbon layer" herein preferably refers to "pyrolytic carbon layer". Any carbon layer can be present anywhere in the multilayer. This means that the multilayer can comprise a pyrolytic carbon layer sandwiched between refractory carbide containing layers. A pyrolytic carbon layer can be an outermost layer. In the device, a pyrolytic carbon layer could also be sandwiched between an innermost refractory carbide containing layer and the material of the device.

The term "average thickness" as used herein, refers to the thickness determined from SEM cross-section images that are made by cutting or breaking the multilayer (and the material, if the multilayer is part of the device). The layers can be distinguished in SEM section images by their appearance, e.g. brightness contrast, grain size, morphology, or porosity. The thickness of an individual layer can be determined by measuring the distance between the lower boundary and upper boundary of the layer along at least 5 lines running perpendicular to the multilayer surface. The lines must be placed in various locations with layer thicknesses representative of the majority of the total layer. The layer thickness is the average of the single line measurements.

According to the invention, the first layer has an average thickness of at least 25 nm, preferably at least 100 nm, e.g. at least 1 μm. Average thickness of the first layer can be very large as it is possible to continue a deposition process until a very thick layer has formed. The average thickness of the first layer in free-standing multilayers typically does not exceed 5 mm. In the context of the device of the invention, the first layer is typically thin. When the multilayer of the invention is on a surface of a material, the materials strength will prevent even very thin multilayers—and individual layers comprised by the multilayer—from cracking. The (multi)layer is stabilized by the material. The average thickness of the first layer comprised by a multilayer of a device according to the invention can, for example, be in a range from 25 nm to 200 μm, preferably in a range from 100 nm to 180 μm, in particular in a range from 1 μm to 160 μm. In the context of the free-standing multilayer of the intention, the first layer is typically much thicker. The average thickness of the first layer comprised by a free-standing multilayer according to the invention can, for example, be in a range from 0.25 μm to 5 mm, preferably in a range from 1 μm to 3 mm, in particular in a range from 10 μm to 2 mm.

The same considerations apply for the second and third layer.

The average thickness of the second layer comprised by a multilayer of a device according to the invention can, for example, be in a range from 25 nm to 200 μm, preferably in a range from 100 nm to 180 μm, in particular in a range from 1 μm to 160 μm. The average thickness of the second layer comprised by a free-standing multilayer according to the invention can, for example, be in a range from 0.25 μm to 5 mm, preferably in a range from 1 μm to 3 mm, in particular in a range from 10 μm to 2 mm.

The average thickness of the third layer comprised by a multilayer of a device according to the invention can, for example, be in a range from 25 nm to 200 μm, preferably in a range from 100 nm to 180 μm, in particular in a range from 1 μm to 160 μm. The average thickness of the third layer comprised by a free-standing multilayer according to the invention can, for example, be in a range from 0.25 μm to 5 mm, preferably in a range from 1 μm to 3 mm, in particular in a range from 10 μm to 2 mm.

The average thickness of every individual layer is preferably in a range from 0.025 µm to 500 µm, most preferably 0.05 µm to 250 µm, in particular 0.1 µm-200 µm, e.g., 0.2 µm to 150 µm for every layer which is a layer of a multilayer of the device. The average thickness of every individual layer is preferably in a range from 0.1 µm to 100 mm, most preferably 0.2 µm to 50 mm, in particular 0.3 µm to 10 mm, e.g., 0.4 µm to 5 mm for every layer which is a layer of a free-standing multilayer. Positive effects of the layers are more consistent if each of the layer's average thickness increases a certain minimum. Tops of individual grains of a lower layer could influence crystal growth on an outer layer even through a very thin interlayer. Above the upper limits of the thickness ranges, coating takes very long. This makes the coating method quite expensive and the material or part on which the layer is deposited might bend due to mechanical stresses, which could also be caused by thermal expansion mismatch between layers and material coated.

The average thickness of the multilayer is preferably in a range from 1 µm to 1 mm if the multilayer is a multilayer of the device. This ensures reliable protection of the material coated with the multilayer at reasonable deposition times and thus at reasonable costs. The average thickness of the multilayer is preferably in a range from 100 µm to 100 mm if the multilayer is a free-standing multilayer.

According to the invention, the first layer has a larger mean linear intercept section grain size than the second layer. This expresses in a more quantitative way that the first layer generally contains larger crystals than the second layer. Mean linear intercept section grain size of a layer can be determined from a cross section in an electron micrograph, by counting the number of grain boundaries on a line that crosses at least 20 grain boundaries which is at half thickness of the layer. The mean linear intercept section grain size is calculated by dividing the length of the line by the number of grain boundaries on that line, analogous to the definition of 'mean linear intercept grain size' in ISO 13383-1:2012 (EN).

As found by the inventors, the crystal size can be controlled very flexibly and easily by modifying the CVD coating conditions. It was found that pores which seem to interfere with the growth of refractory carbide crystals are formed under certain conditions. This is described in connection with example 3 below. Other conditions seem to favor the deposition of elemental silicon, which appears to interfere with the growth of refractory carbide crystals. There are thus various possibilities for ensuring that refractory carbide crystals of one layer grow larger than refractory carbide crystals of another layer. This results in a multilayer in which the first layer has a larger mean linear intercept section grain size than the second layer. The invention does not require any other difference of first and second layer than mean linear intercept section grain size. However, the invention does not exclude other differences of first and second layer than mean linear intercept section grain size, as described in the following.

The second layer can, for example, contain more of a non-carbon constituent (e.g. silicon) of the refractory carbide (e.g. silicon carbide), than the first layer. When the refractory carbide contained in the second layer is silicon carbide, the second layer can, for example, contain more silicon than the first layer. It has surprisingly been found that this prevents the formation of deep etch pits as shown in FIGS. 2 & 9A, therefore providing an additional protection mechanism to the multilayer device. The inventors further assume that toughness of the multilayer is increased because the silicon rich layers are easier to deform (lower Youngs modulus/hardness) and mitigate stresses. It also allows to tune the crystal size (i.e. the surface grain size) at the outer surface of the multilayer if an outermost layer of defined thickness is deposited onto such second layer, as discussed below with reference to FIG. 15. The elemental Silicon is detectable by XRD in the multilayer. If it is not in the outermost layer and the outermost layer is thick, the multilayer coating can be removed stepwise and after each removal XRD can be applied. XRD penetration depth is about 30 to 50 µm. The Si to C atomic can be determined via EDXS, XPS, or TOF-SIMS measurements and can, for example, be in a range from 1.01:1 to 10:1, preferably 1.03:1 to 4:1, e.g. 1.1 to 1 to 2:1.

The porosity of the second layer can exceed the porosity of the first layer. This causes deflection of cracks and increases etch resistivity, which ensures use of the component (i.e. device or multilayer) for a long time in high temperature and/or corrosive environment applications. The porosity, defined here as the volume fraction of pores in the layer, can be measured from SEM images. For that, a cross-section of the coating is prepared by cutting and gentle polishing, breaking and gentle polishing, or the focused ion beam (FIB) method. In the cross-section, the pores and the solid refractory carbide can be distinguished via the brightness contrast. The area of the cross section covered by pores can be measured for each layer and divided by the total inspection area, giving the area fraction of pores. Assuming that the pores are homogeneously distributed over the volume of the coating, the area fraction of pores is equal to the porosity as defined above. The porosity of the second layer can, for example be 0.05 to 30% porosity, preferably 0.1 to 20% porosity, most preferably 0.15 to 10% porosity. Where porosity is larger, the layer density is small and vice versa. Layer density is also determined from SEM image analysis as described for the porosity.

In the multilayer, the second layer can be sandwiched between the first layer and the third layer. Further, the third layer can have a larger mean linear intercept section grain size than the second layer. This combines the generally good hardness/density of two layers (first and third) containing larger refractory carbide crystals (or having larger mean linear intercept section grain size) with protection against deep etch pit formation and mechanical failure through the whole coating. It also allows to tune the surface crystal size (i.e. the surface grain size) by selecting the thickness of the outermost layer accordingly.

In the multilayer, the first layer can alternatively be sandwiched between the second layer and the third layer Further, the first layer can have larger mean linear intercept section grain size than the third layer, i.e. the first layer can have larger mean linear intercept section grain size than the second as well as the third layer. This combines the generally good hardness/density of one layers (first) containing larger refractory carbide crystals (or having larger mean linear intercept section grain size) with protection against deep etch pit formation and mechanical failure through the whole coating. It also allows for depositing a fourth outermost layer with tuned surface crystal size (i.e. the surface grain size) by selecting the thickness of the fourth outermost layer accordingly.

In a further alternative multilayer, the second layer can contain more of a non-carbon constituent (e.g. silicon) of the refractory carbide (e.g. silicon carbide), than the first layer and the porosity of the third layer can exceed porosity of the first layer. When the refractory carbide is silicon carbide in this further alternative multilayer, the second layer can contain more silicon, than the first layer and the porosity of the third layer can exceed porosity of the first layer. This provides increased etch resistivity, increased mechanical stability, and tunable crystal size (i.e. surface grain size).

In a preferred multilayer, the average thickness of the first layer is larger than the average thickness of the second layer. The inventors do not assume that the positive effects brought along with the second layer would increase linearly with the thickness of the second layer when the second layer is relatively thick. For a given total multilayer thickness, it is therefore advantageous to have instead an increased thickness of the first, more robust layer, having a larger mean linear intercept section grain size.

A preferred multilayer has a mean linear intercept surface grain size in a range from 0.1 to 50 µm, further preferred 0.2 to 40 µm, most preferred 0.3 to 30 µm, particularly preferred 0.4 to 20 µm, e.g., 0.5 to 10 µm. The mean linear intercept surface grain size is measured according to the definition of 'mean linear intercept grain size' in ISO 13383-1:2012 (EN). Technical effect associated with surface grain size: Larger surface grain size means overall shorter surface grain boundary length. Nevertheless it was surprisingly found that more etching damage is observed. Therefore smaller surface grain sizes are preferred.

The invention further relates to a CVD method for preparing a multilayer according to the invention wherein a refractory carbide layer that contains more or less of a non-carbon constituent (e.g. silicon) of the refractory carbide (e.g. silicon carbide) than a neighboring layer, and/or a refractory carbide layer having another porosity than a neighboring layer is/are formed. The refractory carbide layer that contains more or less of the non-carbon constituent (e.g. silicon) of the refractory carbide (e.g. silicon carbide) than the neighboring layer and/or the refractory carbide layer having another porosity than the neighboring layer is preferably deposited under conditions (e.g. conditions A) of
  atmosphere composition,
  pressure, and/or
  temperature of the CVD coating atmosphere that differ from the conditions (e.g. conditions B) of
  atmosphere composition,
  pressure, and/or
  temperature of the CVD coating atmosphere
that are applied in a preceding or subsequent layer formation step. According to a preferred method of the invention, three or more layers of the multilayer are formed by periodically altering conditions A and conditions B. If a multilayer with more than two different types of layers is desired, it is possible to deposit a further layer under conditions (e.g. conditions C) of
  atmosphere composition,
  pressure, and/or
  temperature of the CVD coating atmosphere
that differ from the conditions A and from conditions B.

Preferably, the CVD method of the invention involves thermal CVD. Thermal CVD is different from plasma enhanced chemical vapor deposition (PECVD). Thermal CVD typically requires much higher temperatures than PECVD, but does not require a plasma source. The expression "thermal CVD" herein refers to CVD at a temperature of at least 800° C. A particularly preferred CVD method of the invention is a thermal CVD method, wherein the entire multilayer is deposited at temperatures of 800° C. or higher.

The refractory carbide layer having another porosity than the neighboring layer can, for example, be deposited from a CVD coating atmosphere by altering a content of a carbon source, e.g. by altering the content of a carbon source selected from $CH_4$, $C_2H_2$, $C_2H_4$, $C_2H_6$, $C_3H_6$, $C_3H_8$, $C_4H_8$, or $C_4H_{10}$ in the CVD coating atmosphere.

According to a preferred method of the invention,
  the refractory carbide layer that contains more or less of the non-carbon constituent (e.g. silicon) of the refractory carbide (e.g. silicon carbide) than the neighboring layer, or
  the refractory carbide layer having another porosity than a neighboring layer
is/are formed and a layer having larger mean linear intercept section grain size is deposited thereon, and deposition of the layer having larger mean linear intercept section grain size is continued until the outer surface of the layer having larger mean linear intercept section grain size reaches a predefined mean linear intercept surface grain size.

The invention further relates to a multilayer or device obtainable according to a method of the invention.

A further aspect of the invention is the use of a multilayer of the invention as a coating of a support for increasing the lifetime of a support in an etching gas containing atmosphere and/or when exposed to mechanical stress. The support is preferably a support for semiconductor applications as mentioned hereinabove. The etching gas can, for example, contain, HCl, $NH_3$, $H_2$, $N_2$, a halogen, gallium, aluminium, arsenic, $Al(CH_3)_3$ or a silane. Although the high resistivity of multilayers of the invention was demonstrated by the inventors for etching with HCl, it is believed that same or similar effects would be observable also with other gases. This is because the exact nature of boundaries or gaps between grains seems to govern the etching process and other gases than HCl would migrate into these gaps just like HCl.

BRIEF DESCRIPTION OF THE FIGURES

The invention is explained in more detail by the following non-limiting figures and examples.

For each figure (and in case of FIGS. 1 to 3 for each of the panels arranged in rows and columns), hatching of a refractory carbide layer with parallel lines from lower left to upper right (as shown, for example, in the top most row of FIG. 1) indicates mean linear intercept section grain size that is larger than in any directly neighbored refractory carbide layer. Crisscrossing with horizontal and vertical lines (as in the middle line of FIG. 1) indicates a high porosity which exceeds the porosity of any directly neighbored refractory carbide layer. Circles (as in the layers in the middle column of FIG. 2) indicate a layer that is rich in a non-carbon constituent of the refractory carbide, and contains more of the non-carbon constituent of the refractory carbide than any directly neighbored refractory carbide layer.

Figure 5:
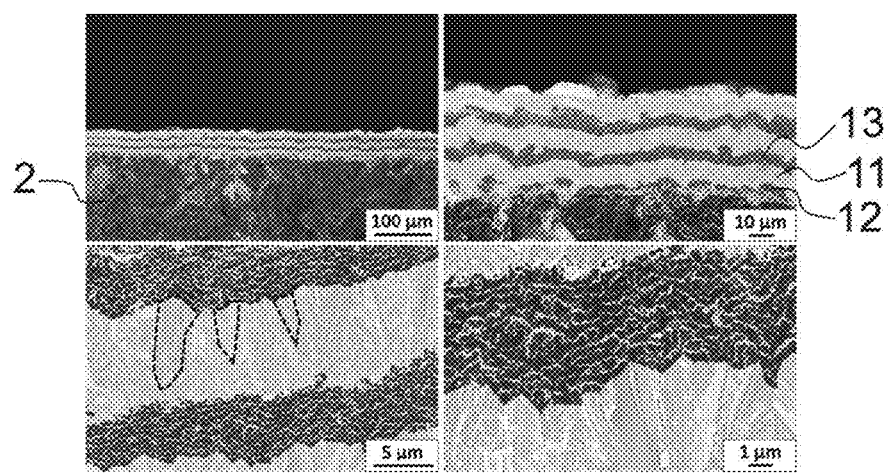

FIG. 5 Cross section scanning electron microscopy (SEM) images of devices of the invention with multilayer formed according to example 1a.

Figure 6:
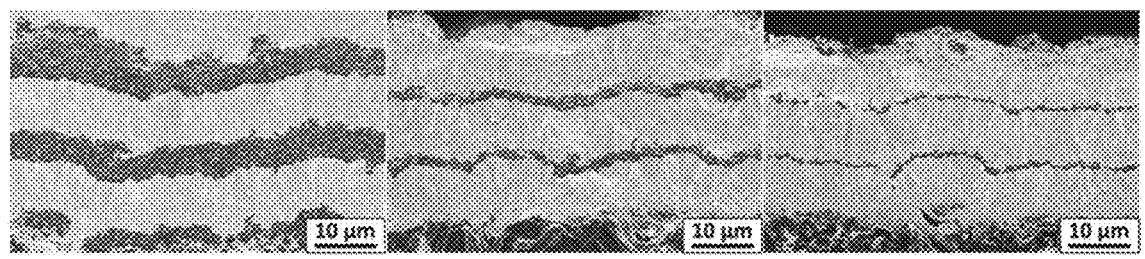

FIG. 6 SEM images of devices of the invention with multilayers comprising six layers formed according to examples 1a (left SEM image), 1b (middle SEM image), 1c (right SEM image).

Figure 7:
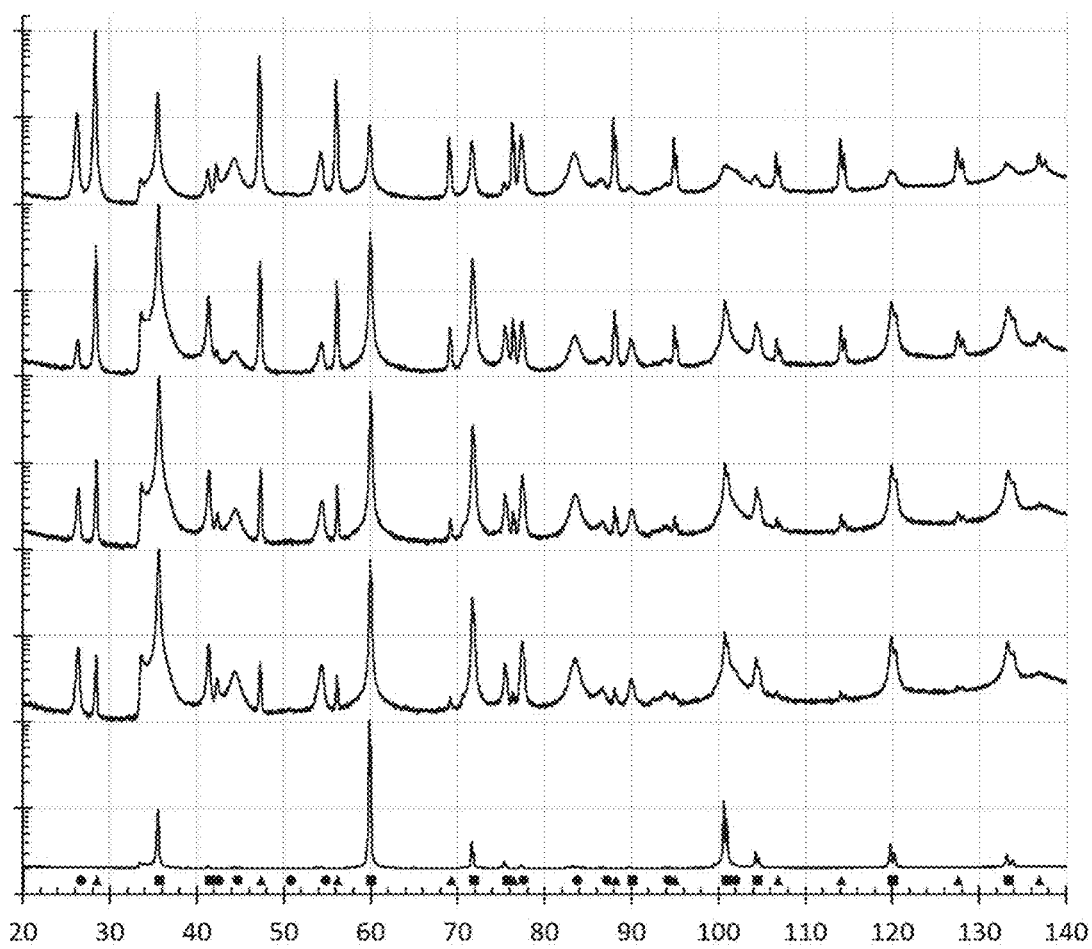

FIG. 7. X-ray diffractograms (XRD) of samples coated with various silicon carbide-based layers, including a single silicon carbide layer with large crystals (bottom), a silicon-rich silicon carbide layer (top), and samples 1a, 1b, and 1c (middle).

Figure 8:
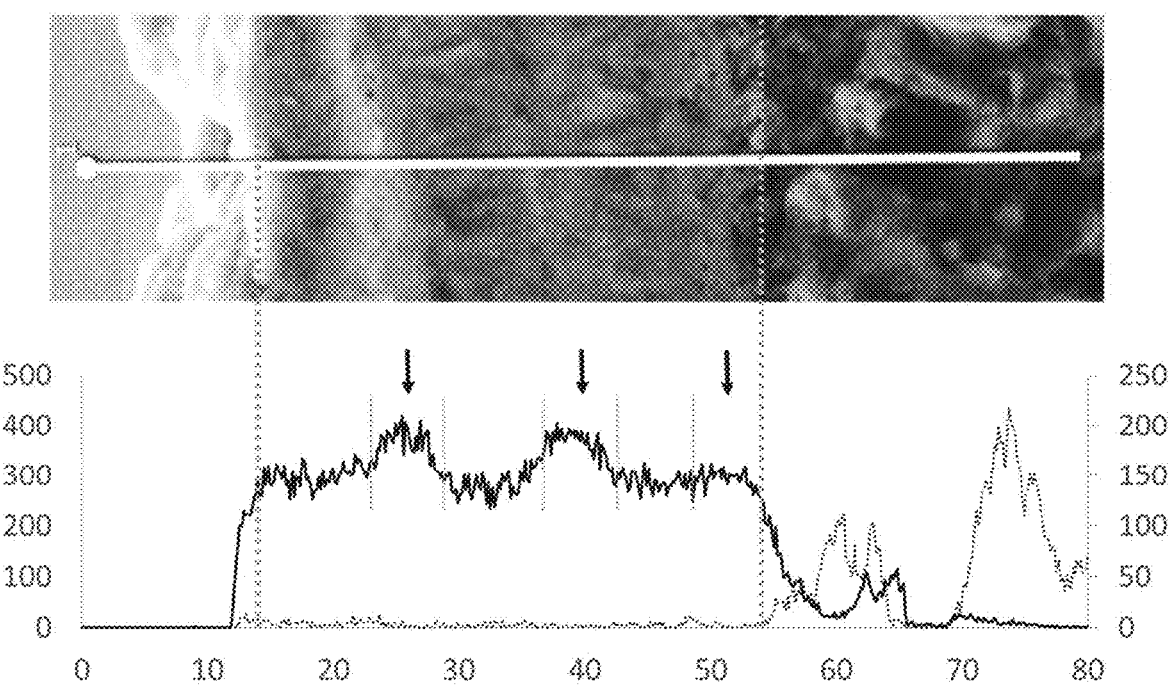

FIG. 8 EDXS line scan measured on the cross-section of an exemplified multilayer comprising six layers.

Figure 9:
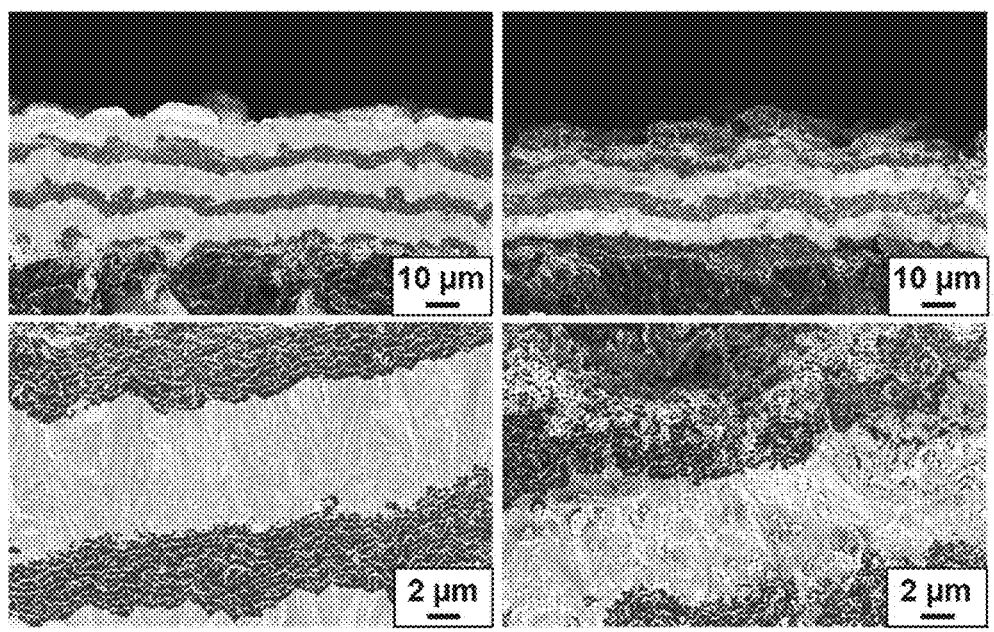

FIG. 9. Cross-section SEM images of a multilayer comprising six layers before (left) and after (right) etching in HCl gas at 1300° C., with deep etch pit shown in FIG. 9A.

Figure 11:
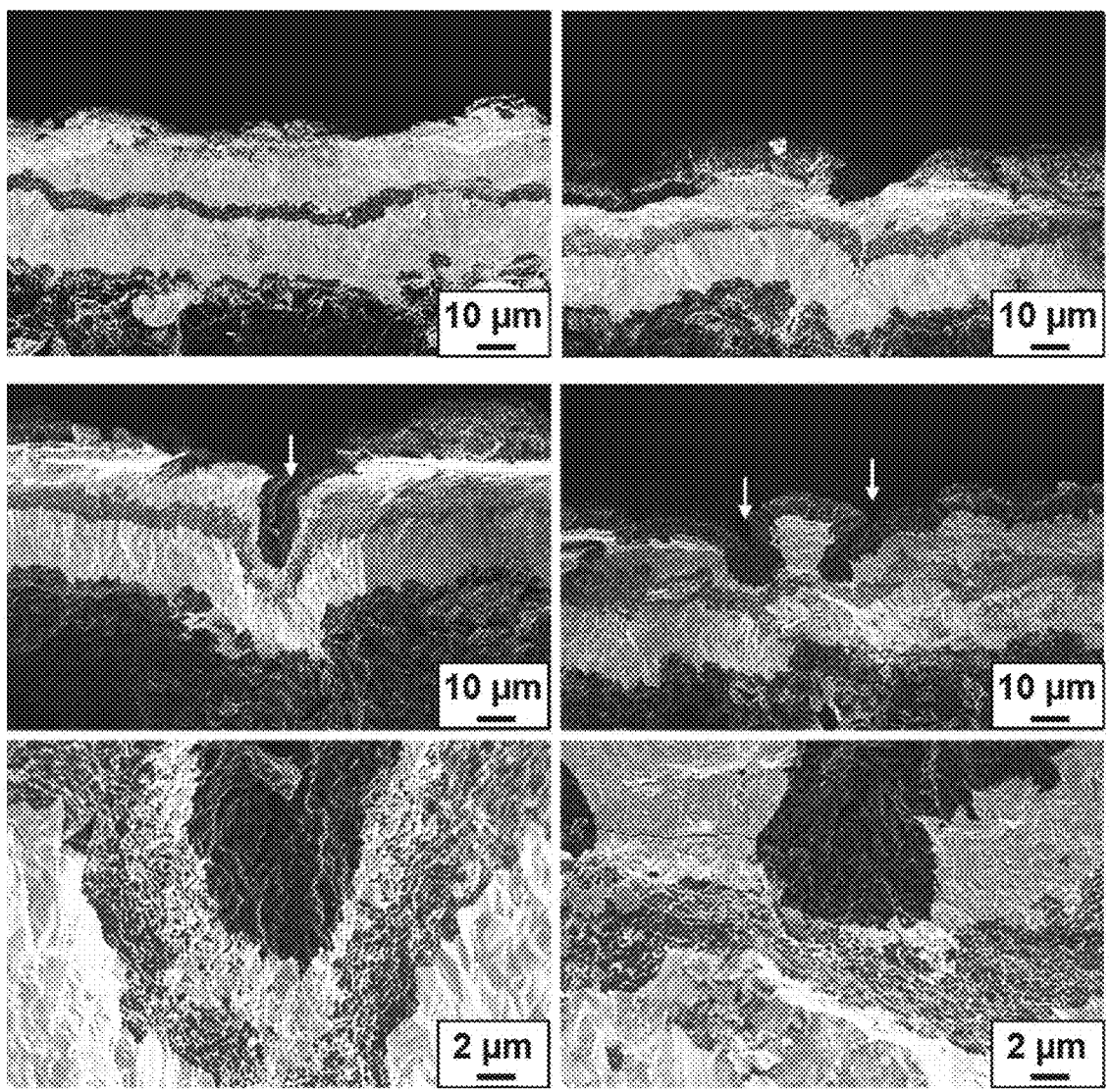

FIG. 11. Etching of the four-layer multilayer with hot HCl gas, showing uniform surface etching and localized pits halted at the silicon-rich layer due to crystal boundary disruptions.

Figure 13:
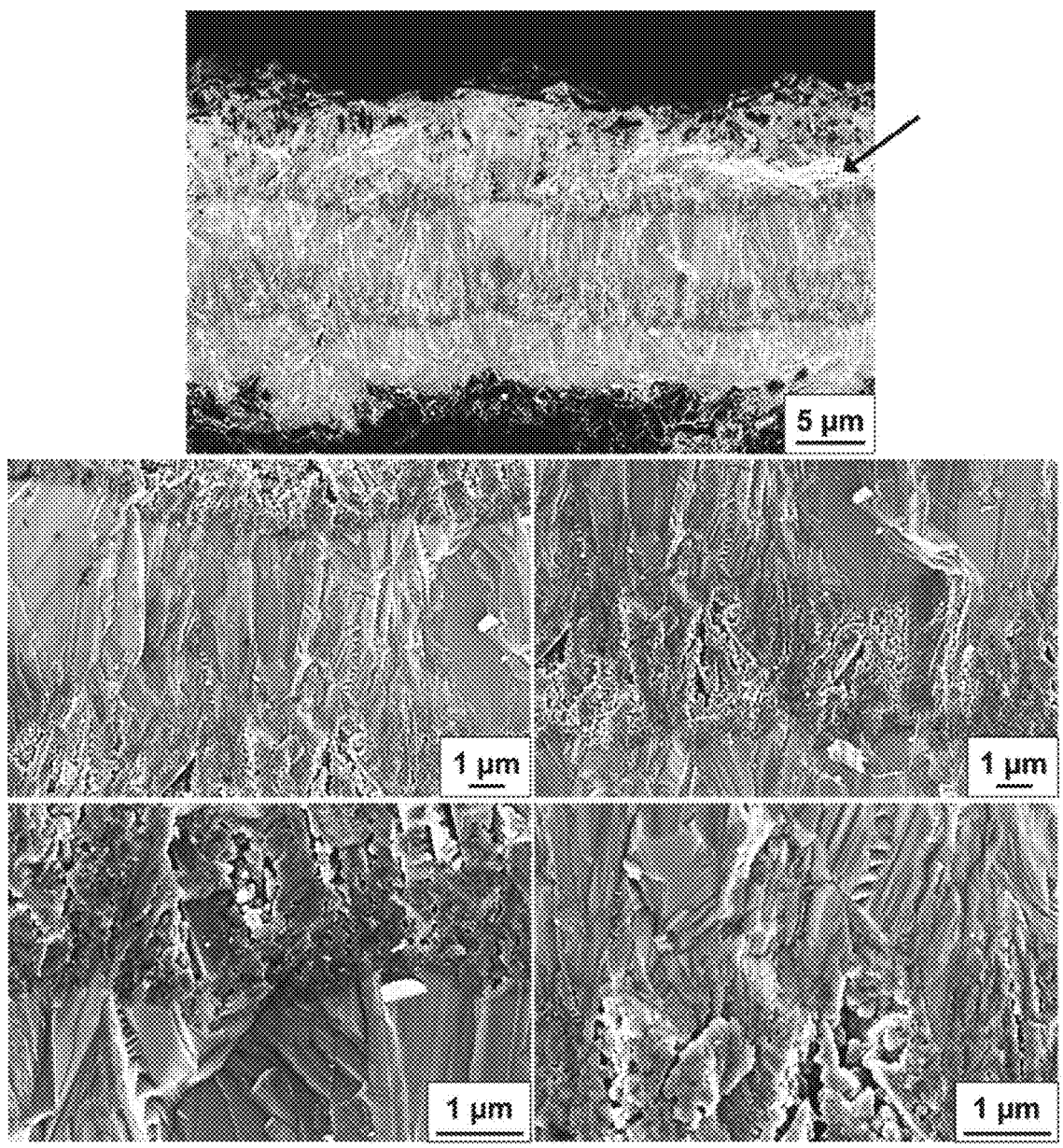

FIG. 13. SEM cross-section images of a device according to example 3.

Figure 14:
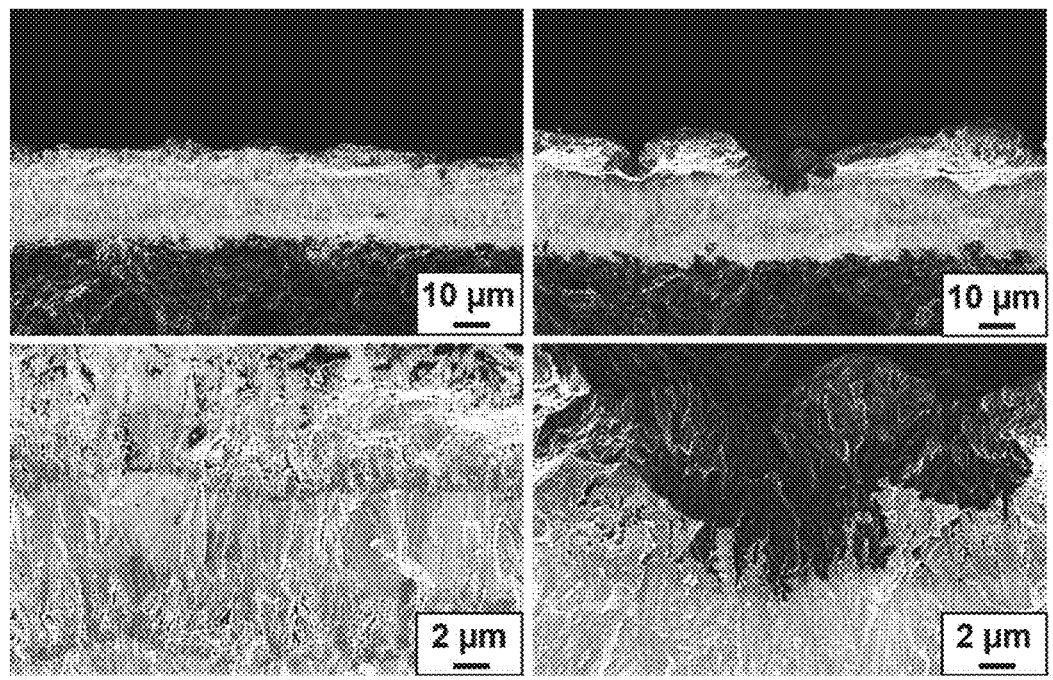

FIG. 14. SEM images for HCl gas etching of coated samples, with primary etching of the top layer and dendritic etching in underlying porous layers.

Figure 15:
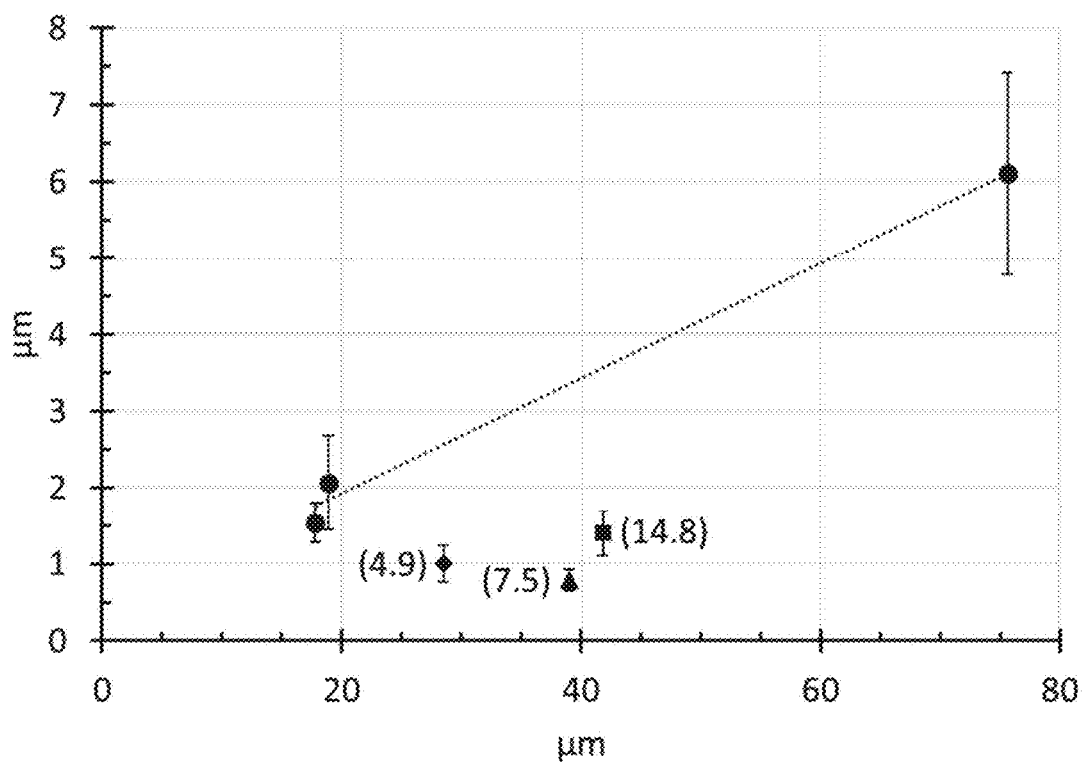

FIG. 15. Surface grain size vs. total thickness for silicon carbide coatings, showing thickness-dependent growth in single layers and outermost layer influence in multilayers. The mean linear intercept surface grain sizes (vertical axis) are plotted against total layer thicknesses (horizontal axis).

Figure 16:
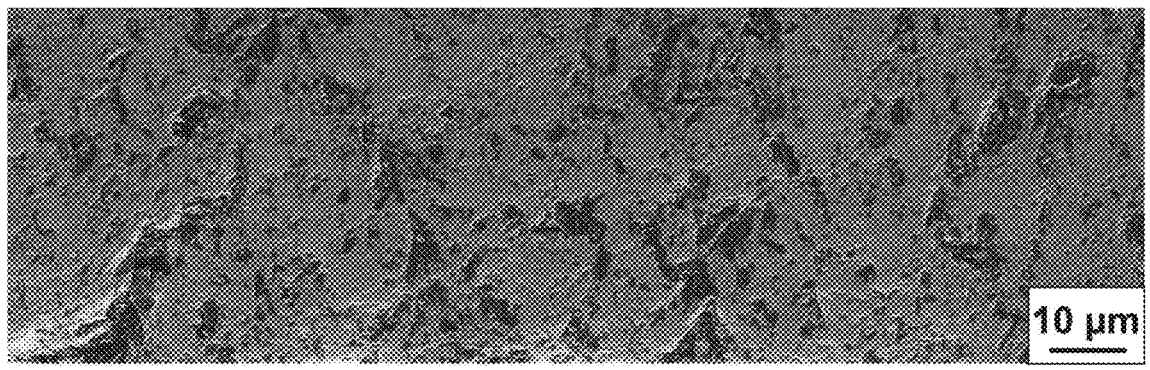

FIG. 16. SEM image of a polished cross section of a porous single-layer coating from Example 3.

DETAILED DESCRIPTION

Figure 1:
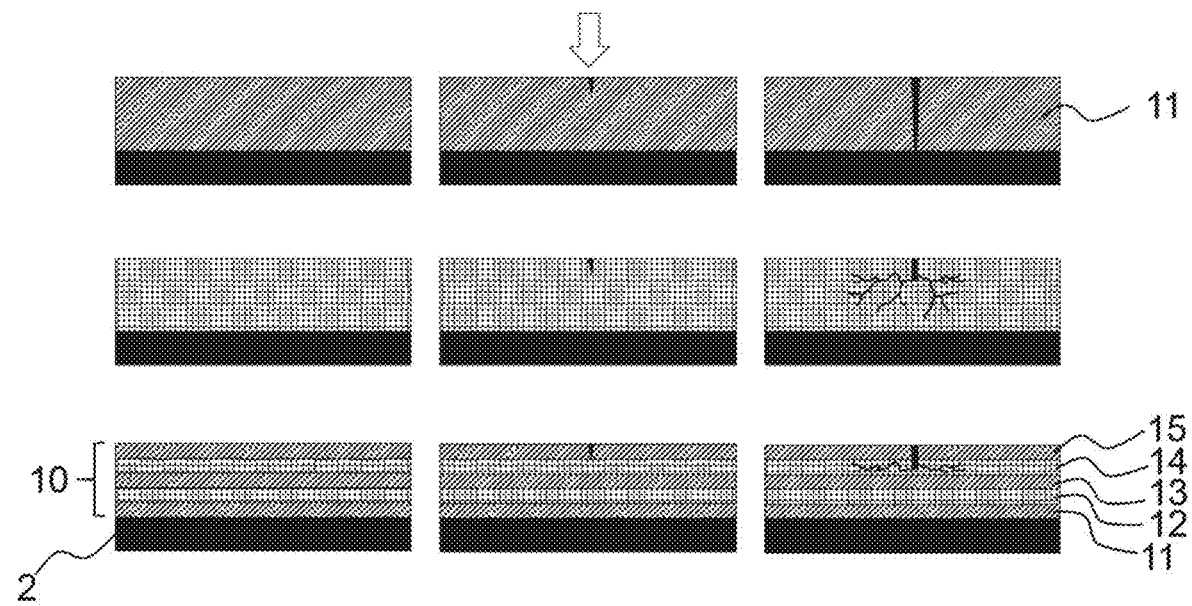
FIGS. 1 to 4, 10 and 12 show enlarged schematic representations of sections of devices for high temperature applications. Each of the figures (and in case of FIGS. 1 to 3 each of the panels arranged in rows and columns) shows only a portion of the device and the portion includes a portion of a part 2 of the device (shown in black at the bottom of each panel) and a portion of a refractory carbide layer on a surface of part 2.

The device illustrated in the three panels at the bottom of FIG. 1 comprise a refractory carbide multilayer 10 of the invention on the surface of part 2. The refractory carbide multilayer 10 comprises a first layer 11, a second layer 12, a third layer 13, a fourth layer 14 and a fifth layer 15. It cannot be seen from the schematic representations of FIG. 1 that each layer 11, 12, 13, 14, and 15 can have an average thickness far above 25 nm and that it contains at least one refractory carbide. In this example, the first, third, and fifth layers 11, 13, and 15 have a larger mean linear intercept section grain size than the second and the fourth layers 12, and 14 and the porosity of layers 12 and 14 exceeds porosity of the first, third, and fifth layers, 11, 13, and 15.

FIG. 1 further illustrates the effect of a mechanical force (see arrow at the top) and how multilayers of the invention help mitigate crack propagation by deflecting the crack along the planes of the layers thus reducing the chance of the crack reaching a substrate. As illustrated in the upper and middle row, right panels, crack propagation can go down to the surface of part 2 very easily in single layers with large refractory carbide crystals (see top right panel) or in single high porosity refractory carbide layers (see middle row, right panel).

Figure 2:
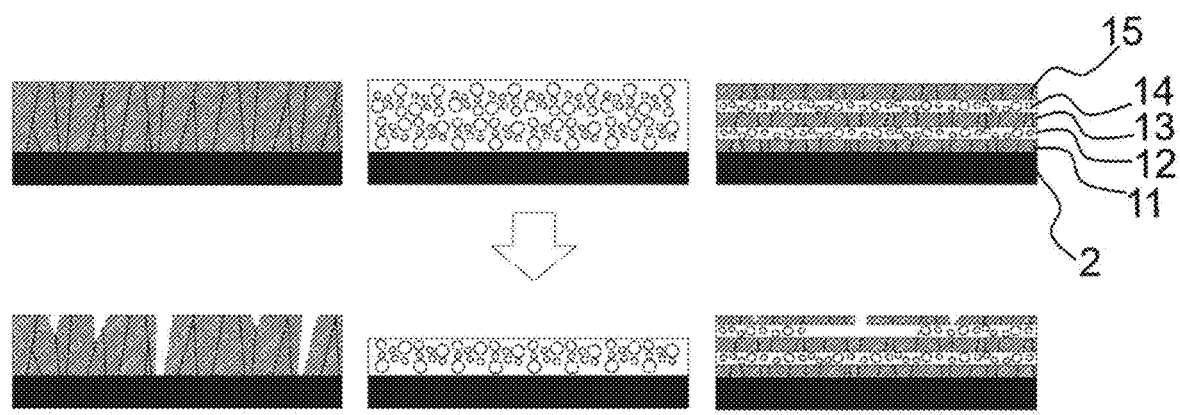

The device illustrated on the right of FIG. 2 comprises a refractory carbide multilayer 10 of the invention on the surface of part 2. The refractory carbide multilayer 10 comprises a first layer 11, a second layer 12, a third layer 13, a fourth layer 14 and a fifth layer 15. Each layer 11, 12, 13, 14, and 15 has an average thickness far above 25 nm and it contains at least one refractory carbide. In this example, the first, third, and fifth layers 11, 13, and 15 have a larger mean linear intercept section grain size than the second and the fourth layers 12, and 14. Layers 12 and 14 differ from layers 12 and 14 shown in FIG. 1. In contrast to the multilayer shown in FIG. 1, layers 12 and 14 contain more of a non-carbon constituent of the refractory carbide than any directly neighbored refractory carbide layer 11, 13 or 15.

FIG. 2 further illustrates refractory carbide multilayers resistance against hot HCl gas, which is a common etching gas used in semiconductor applications of refractory carbide coated graphites. The upper row shows the initial states of different devices with different layers before etching. The arrow between the upper and the lower row indicates HCl etching. The lower row illustrates states of different devices with different layers after etching. It is known that an outer silicon carbide layer with atomic ratio Si:C=1 can withstand the etching by hot HCl gas (a common gas used in semiconductor applications of SiC-coated graphite) better than silicon enriched SiC. Therefore, having a layer or layers of stoichiometric SiC, which typically implies larger crystals (or a larger mean linear intercept section grain size) than in neighboring non-stoichiometric layers, could help increase the lifetime. The inventors have surprisingly found that including less etch-resistant layers (like layers containing more of a non-carbon constituent of the refractory carbide, e.g. silicon enriched SiC) can nevertheless increase the lifetime of the refractory carbide layer when exposed to etching gases. It is assumed that the less etch resistant layers act as sacrificial layers that slow the etching and change the preferred direction of etching from perpendicular to parallel to the surface. This is understood from FIG. 2, lower column. While punctual etching down to the graphite surface occurs in layers with atomic ratio Si:C=1 (see deep etch pits in FIG. 2, lower row on the left), a single layer containing excess silicon is overall less resistant to and consumed by the HCl (see FIG. 2, lower row in the middle). The multilayer of the device on the right surprisingly provides the best etch protection to the coated graphite as it avoids both, punctual etching down to the graphite surface, and overall fast consumption of the (multi)layer. The tuning of atomic ratio (e.g. the atomic ratio Si:C) in individual layers of refractory carbide (e.g. silicon carbide) multilayers can thus reduce the chemical etching in some key applications.

Figure 3:
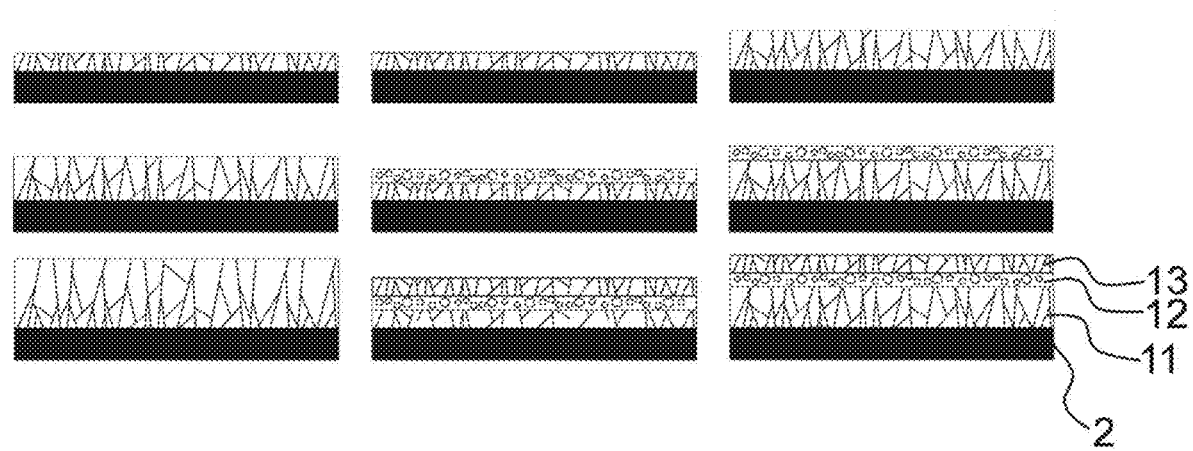

FIG. 3 is a schematic representation of surface grain size control utilizing the multilayer approach of the present invention. The three panels on the left show columnar growth of refractory carbide for a thin layer of refractory carbide obtained after short CVD coating time (top panel), for a slightly thicker layer of refractory carbide obtained after intermediate CVD coating (middle panel), and for a thick layer of refractory carbide obtained after a long CVD coating time (lower panel). If the SiC growth for a layer thickness as shown in the lower left panel is done in a monolithic manner (i.e. without multi-layers of the invention) the CVD growth patterns such as columnar growth continues in a more or less uniform manner, which in turn means the crystal columns get wider and wider as the growth continues from the initial nucleation site on the graphite surface. This means that the surface grain size at the surface becomes larger as it depends on the diameter of the column itself. As a consequence, the layer thickness would dictate the surface grain size. However, for application of refractory carbide (e.g. SiC-coated) graphite in semiconductor tools such as epitaxy reactors, the morphology of the SiC plays a key role. Some applications require smaller surface grain size while other prefer larger surface grain sizes. The surface grain size also has an impact on the emissivity and controlling the emissivity is often important for controlling radiative energy release from the surface. Multilayers of the invention can interrupt columnar growth such that the surface grain size at the surface is determined largely by the thickness of the outer-most interlayer. This gives a valuable way to tune the surface grain size. The lower right panel shows a portion of a section of a device of the invention where the multilayer comprises a first layer 11 and a third layer 13 which have a larger mean linear intercept section grain size than the second layer 12. The average thickness of the third layer 13, which is a surface layer and determines the surface grain size at the surface, corresponds to the overall thickness of the single layer shown in the top left panel. Nevertheless, stability against mechanical forces and against etching as described above with reference to FIGS. 1 and 2 can be introduced in addition by appropriate choice of layer 12. This results in (multi)layers with unprecedented stability and precisely adapted surface grain size at the outer surface.

In a preferred embodiment of the present invention at least two layers have a smaller mean linear intercept section grain size than the other layer(s). Referring to FIG. 3, lower right panel the first layer 11 has a larger mean linear intercept section grain size compared to the second layer 12 as well as the third layer 13.

Examples 1a, 1b, and 1c—Silicon Carbide Multilayers, Wherein Some Silicon Carbide Layers Contain More Silicon than Other Silicon Carbide Layers Purified (<5 ppm impurities by weight) isostatic graphite 2 has been coated with a silicon carbide multilayer 10 of the invention comprising six layers:
inner most silicon rich silicon carbide layer 12,
silicon carbide layer 11 containing large silicon carbide crystals,
silicon rich silicon carbide layer 13,
silicon carbide layer containing large silicon carbide crystals,
silicon rich silicon carbide layer, and
outer most silicon carbide layer containing large silicon carbide crystals.

The expression "containing large silicon carbide crystals" means that the silicon carbide crystals in the silicon rich layers were smaller. The expression "silicon rich" means that the content of silicon in the layers was higher than in the silicon carbide layers containing large refractory carbide crystals.

Figure 4:
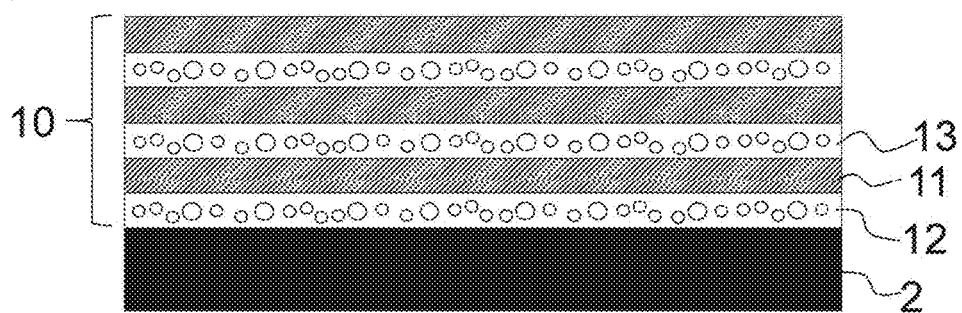

During the CVD process, the isostatic graphite substrate was heated and exposed to a constant flow of hydrogen ($H_2$) and methyl trichlorosilane (MTS) gas at reduced pressures. The MTS did undergo decomposition reactions, which yielded solid SiC on the surface of the substrate. The properties of the SiC, especially the Si content, were tuned by varying the deposition parameters. The six-layer multilayers as shown in FIG. 4 and as described above have been deposited onto graphite during a single CVD run by periodically altering the parameters as shown in the following table:

|  | T/° C. | p/mbar | $H_2$/MTS (volume ratio) |
| --- | --- | --- | --- |
| silicon rich silicon carbide layer | 1100-1350 | 100 | 313 |
| silicon carbide layer containing large silicon carbide crystals | 1100-1350 | 10 | 32 |

During switching the parameters, the MTS flow was turned off for a short time until the pressure and temperature stabilized. In example 1 a, each of the six layers was deposited within 5 minutes, resulting in a total deposition time of 30 minutes. In example 1 b, silicon rich layers were deposited within 2 minutes, resulting in a total deposition time of 21 minutes. In example 1c, silicon rich layers were deposited within only 1 minute, resulting in a total deposition time of only 18 minutes.

FIG. 5 shows cross section scanning electron microscopy (SEM) images of devices of the invention with multilayer formed according to example 1 a. Silicon carbide layer containing large silicon carbide crystals appear bright, silicon rich silicon carbide layers appear dark. Some crystallites are highlighted in the lower left panel of FIG. 5. It is immediately apparent that the silicon carbide crystals in the layer having a larger mean linear intercept section grain size are indeed larger than in any "silicon rich silicon carbide layer".

The layers are well-separated from each other and follow the structure of the graphite substrate. The multilayered coating structure was observed over the whole substrate surface. The silicon carbide crystals in the layers containing the large silicon carbide crystals are initially small (<1 µm) and grow larger (~2-10 µm) as the layer grows thicker. The crystallites in the silicon rich layers are around 0.2-1 µm in diameter and do not grow with increasing layer thickness. The silicon rich layers stop the ripening process of the silicon carbide crystals and restart the crystal ripening process in the next silicon carbide layer deposited on the outer surface of a silicon rich layer. Therefore, the silicon rich interlayers can be inserted in order to tune the maximum silicon carbide crystal size in a layer deposited on the interlayer, independent of the total coating thickness.

FIG. 6 shows SEM images of devices of the invention with multilayers comprising six layers formed according to examples 1a (left SEM image), 1b (middle SEM image), 1c (right SEM image). Even at lower thickness of the silicon rich layers, the crystal ripening process was disrupted, as discussed above.

The multilayer structures can be defined in multiple ways, e.g. by changing the number and order of the layers or by altering the thickness of the layers via their deposition time.

The lowest graph of FIG. 7 shows an X-ray diffractogram (XRD) of a sample coated with a single silicon carbide layer containing large silicon carbide crystals. The uppermost graph of FIG. 7 shows an X-ray diffractogram of a sample coated with a single silicon rich silicon carbide layer. The second third and fourth diffractogram from the top, are of sample 1a, sample 1b and sample 1c, respectively. All X-ray diffractograms in FIG. 7 are plotted with a logarithmic y-axis in order to enhance the visibility of low intensity peaks.

The presence of crystalline elemental silicon was confirmed for those samples with at least one silicon rich layer (FIG. 7, upper four diffractograms with diffraction peaks characteristic for crystalline silicon at angles 2θ indicated with a filled triangle). Diffraction peaks at angles 2θ indicated with a filled square are characteristic for β-SiC. In addition, some diffraction peaks at angles 2θ indicated with filled circles are caused by the graphite substrate.

The multilayers of samples 1a, 1b, and 1c showed both diffraction peaks of β-SiC as well as of crystalline silicon. The relative intensity of the diffraction peaks of crystalline silicon decreased with decreasing thickness of the silicon rich layers. Energy dispersive X-ray spectroscopy (EDXS) was used in order to further confirm that the silicon rich layers (such as those indicated with reference numerals 12 and 13 in FIG. 4) did in fact contain more silicon than the layers having a larger mean linear intercept section grain size (such as the layer indicated with reference numerals 11 in FIG. 4). EDXS is a spectroscopy method that is coupled to SEM and can be performed in a defined region of an SEM image, e.g. in the cross-section of a device comprising a multilayer. FIG. 8 shows an EDXS line scan, measured on the cross-section of an exemplified multilayer comprising six layers. The intensities of the Si $K_\alpha$ and C $K_\alpha$ signals were measured along the indicated line over the cross-section of an exemplified six-layer multilayer. The obtained intensities in counts per second for Si $K_\alpha$ (left axis) and C $K_\alpha$ (right axis) are plotted versus the position along the line (µm). The Si signal intensity varies over the cross-section and shows three maxima in the regions where the silicon rich layers are located (solid line). This confirms that these layers did in fact contain more silicon than the layers having a larger mean linear intercept section grain size. As expected, the C signal, which is in EDXS generally weaker, is strong only on the graphite substrate.

Figure 9A:
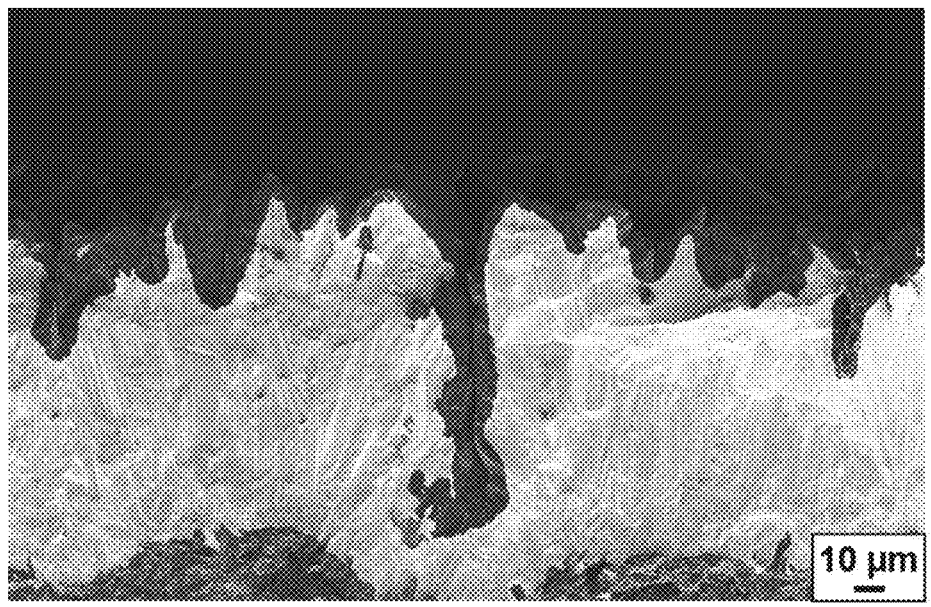

The etch resistivity of exemplified multilayers comprising six layers has been investigated by exposure to an etching gas (a flow of 80 vol % Ar and 20 vol % hydrogen chloride, HCl) at 1300° C. and 100 mbar for 3 h. After etching, the uppermost layer is damaged and partly removed. The underlaying silicon rich silicon carbide layer is partly etched, the four layers underneath are all intact. No deep etch pits have been formed. This can be seen from FIG. 9 which shows cross-section SEM images of a multilayer comprising six layers before (left) and after (right) etching in HCl gas at 1300° C. The fundamental problem of deep etch pits formation in single refractory carbide layers is illustrated also in the SEM image of FIG. 9A. FIG. 9A shows a single SiC layer deposited on a graphite substrate. The layer contains large crystals. The deep etch pit shown in FIG. 9A was observed after exposure to hot hydrogen chloride gas under the same conditions as mentioned above. FIGS. 9 and 9A thus provide experimental evidence for the effects described above in connection with FIG. 2.

Example 2—Silicon Carbide Multilayers Comprising Four Silicon Carbide Layers

Figure 10:
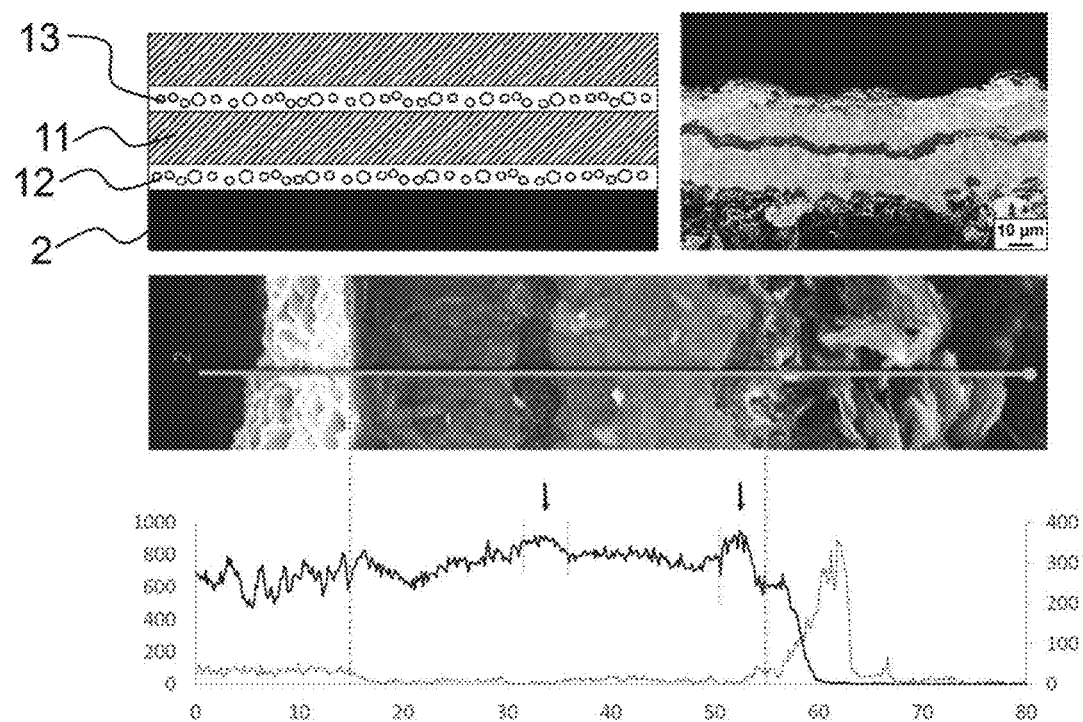

The number and thickness of the individual layers from examples 1a, 1b, and 1c can be altered by altering the deposition sequence and respective deposition times. A multilayer comprising only four silicon carbide layers was obtained by reducing the number of deposition steps from examples 1a, 1b, and 1c from six to four. In order to double the thickness of the silicon carbide layers containing large silicon carbide crystals, their respective deposition times have been doubled. The resulting coating can be seen in FIG. 10 which includes a schematic representation in the upper left part of the figure and an SEM micrograph in the upper right part of the figure. The EDXS line scan shown in the lower part of FIG. 10 confirms excess silicon in the silicon rich layers.

The four-layer multilayer of example 2 was also etched with hot HCl gas as described above for the six-layer multilayer. The majority of the sample was homogeneously etched from the top (FIG. 11, top right panel, compare with sample before etch in top left panel). There are some locations where deeper etch pits have formed (FIG. 11, middle and lower panel). These reached down to the outer silicon rich layer and are stopped there. This can mainly be explained by the disruption of crystal boundaries and the preferred etching along the silicon rich layer.

Crystal boundaries can at some locations extend from the outer surface of a layer to a lower surface of the layer. This can occur in particular in layers containing large refractory carbide crystals in the form of columns. The silicon rich layer appears to disrupt these boundaries very efficiently. HCl entering in the layer along these boundaries is thus spread horizontally in a lower sacrificial silicon rich layer. This prevents HCl from entering deeper into the (multi) layer, preventing the formation of deep etch pits.

Figure 12:
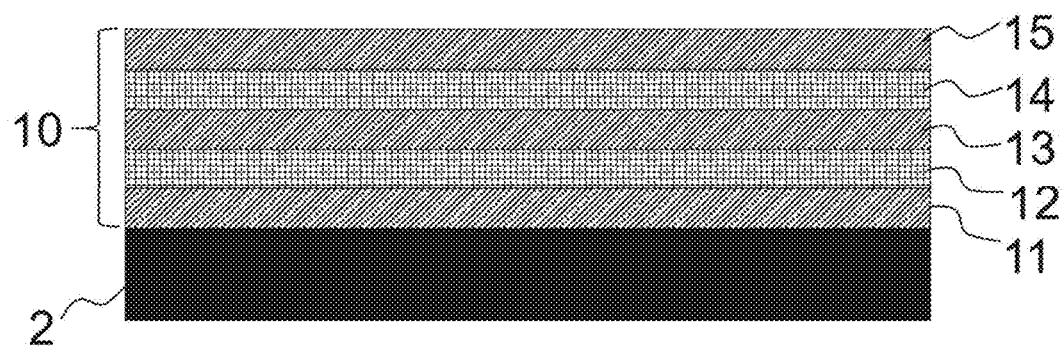

Example 3—Silicon Carbide Multilayer Wherein the Porosity of Some Silicon Carbide Layers Exceeds the Porosity of Other Silicon Carbide Layers A device with multilayer of example 3 is illustrated in FIG. 12. It comprises a refractory carbide multilayer 10 of the invention on a surface of part 2. The refractory carbide multilayer 10 comprises a first silicon carbide layer 11, a second silicon carbide layer 12, a third silicon carbide layer 13, a fourth silicon carbide layer 14 and a fifth silicon carbide layer 15. The porosity of silicon carbide layers 12 and 14 exceeds porosity of silicon carbide layers 11, 13, and 15. Layers 11, 13, and 15 having a larger mean linear intercept section grain size than the layers 12, and 14.

The multilayer containing such alternating layers can be produced via CVD by altering the growth parameters during the CVD run. The multilayer was deposited on isostatic graphite via CVD. Layers 11, 13, and 15 were produced from MTS and $H_2$ gas. The more porous layers 12 and 14 were produced from MTS, $C_2H_4$, and $H_2$ gas in which the Si/C molar ratio in the gas phase can be tuned by the amount of added $C_2H_4$. The growth was not stopped when switching from one layer to another, only the $C_2H_4$ flow was activated/deactivated. The five-layer multilayer of example 3 has been deposited onto graphite during a single CVD run by periodically altering the parameters as shown in the following table:

| | T/° C. | p/mbar | $H_2$/MTS (volume ratio) | C/Si gas phase ratio (molar) |
|---|---|---|---|---|
| porous layers 12 and 14 | 1100-1350 | 10 | 32 | 1.5 |
| SiC layers 11, 13 and 15 | 1100-1350 | 10 | 32 | 1 |

FIG. 13 shows SEM cross-section images of a device according to example 3. The SEM cross-section images (FIG. 11) show the presence of 5 well-separated layers, from which three are dense and facetted and two are porous. The layers grew well on top of each other, and formed quite sharp interfaces. During sample preparation (breaking the coated graphite sample), a part of the top layer has delaminated (arrow in top panel of FIG. 13). This indicates that the porous layer has a lower toughness, which appears to be beneficial for crack deflection as discussed in FIG. 1. A difference in elemental composition cannot be seen in EDXS. XRD only showed the presence of silicon carbide and graphite, the latter probably caused by the graphite substrate.

As for other examples, the etch resistivity has been investigated in HCl gas. SEM images show that mainly the top layer of the coating is etched (FIG. 14). When HCl reaches the underlying porous layer, it etches further in a dendritic way. This appears to be beneficial for deflecting and stopping deeper etch pits. The effects of porous layers are thus similar to the effects discussed above for silicon rich layers in silicon carbide multilayers.

Example 4—Determination of Mean Linear Intercept Surface Grain Sizes

Mean linear intercept surface grain sizes were determined according to the definition of 'mean linear intercept grain size' in ISO 13383-1:2012 (EN) on outer surfaces of different devices comprising silicon carbide multilayers of the invention or comparative silicon carbide single layers. In all examples, the outer surface from which mean linear intercept surface grain sizes were derived, was deposited under conditions as mentioned in the table above for examples 1a, 1b, 1c, for a "silicon carbide layer containing large silicon carbide crystals".

In FIG. 15, mean linear intercept surface grain sizes (vertical axis) are plotted against total layer thicknesses (horizontal axis). Data obtained for comparative silicon carbide single layers is represented by filled circles. For silicon carbide single layers, mean linear intercept surface grain sizes were found to increase with increasing thickness of single layers, as is understood from the dotted line in FIG. 15. Data obtained for silicon carbide multilayers of the invention is represented by a filled triangle (sample from example 1 a), a filled square (sample from example 2), and a filled diamond (sample from example 3). As indicated with the numbers in brackets in FIG. 15, the outermost layer of one of the investigated silicon carbide multilayers with total thickness of about 39 µm had an average thickness of 7.5 µm. The outermost layer of the other investigated silicon carbide multilayer with total thickness of about 42 µm had an average thickness of 14.8 µm. The outermost layer of the third investigated silicon carbide multilayer with total thickness of about 29 µm had an average thickness of 4.9 µm The mean linear intercept grain size was found to depend on the average thickness of the outermost layer, when the outermost layer is deposited on a silicon rich or porous silicon carbide layer, as suggested by the present invention.

According to the invention, it is thus not only possible to increase etch resistivity and resistivity against mechanical forces. In addition, the mean linear intercept surface grain size can be controlled very accurately by choosing the thickness of the outermost layer accordingly. The multilayer and devices of the invention can thus, due to their high resistivity, be used for a long time in a broad range of different semiconductor applications and even in those applications requiring particularly small or large surface grain sizes.

Example 5—Determination of Porosity in Layers with a High Porosity

The porosity of a single layer coating deposited under the conditions mentioned as "porous layers 12 and 14" in example 3 has been estimated. The coated sample had been broken and the cross section was gently polished using first a diamond polishing disk, and then a diamond slurry. The resulting polished cross section was investigated via SEM as seen in FIG. 16, where the area of the cross section containing pores can be easily distinguished from the dense areas via the brightness contrast. The porosity has been calculated by measuring the area of the cross section containing pores and dividing this area by the total inspection area. This was performed in three locations along the cross section and the average porosity and standard deviation was estimated to be 25%±4%.

The invention claimed is:

1. A refractory carbide multilayer comprising a first layer, a second layer, and a third layer, wherein:
   a. the first layer has an average thickness of at least 25 nm and contains at least one refractory carbide,
   b. the second layer has an average thickness of at least 25 nm and contains at least one refractory carbide,
   c. the third layer has an average thickness of at least 25 nm and contains at least one refractory carbide,
   d. the first layer has a larger mean linear intercept section grain size than the second layer; and wherein the second layer is sandwiched between the first layer and the third layer, and the third layer has a larger mean linear intercept section grain size than the second layer, and
   wherein the second layer contains more of a non-carbon constituent of the refractory carbide than the first layer.

2. A device for high temperature applications in a range from 200 to 4,000° C., wherein the device comprises a multilayer of claim 1 on a surface of a material of the device.

3. The refractory carbide multilayer according to claim 1, wherein at least one refractory carbide of at least one of the layers comprises a silicon carbide, tantalum carbide, niobium carbide, hafnium carbide, tungsten carbide, boron carbide, tantalum niobium carbide, tantalum hafnium carbide, or a niobium hafnium carbide.

4. The refractory carbide multilayer according to claim 1, wherein the non-carbon constituent is silicon and/or the refractory carbide is silicon carbide.

5. The refractory carbide multilayer according to claim 1, wherein porosity of the second layer exceeds porosity of the first layer.

6. The refractory carbide multilayer according to claim 1, wherein
   e. the average thickness of every individual layer is in a range from 0.025 µm to 500 µm for every layer which is a layer of a multilayer of the device, or
   f. the average thickness of every individual layer is in a range from 0.1 µm to 100 mm for every layer which is a layer of a free-standing multilayer.

7. The refractory carbide multilayer according to claim 1 wherein an outer surface has a mean linear intercept surface grain size in a range from 0.1 to 50 µm.

8. The device according to claim 2, wherein the material of the device comprises graphite or elemental silicon.

9. A chemical vapor deposition (CVD) method for preparing the multilayer according to claim 1, comprising:
   depositing a first layer having an average thickness of at least 25 nm and containing at least one refractory carbide;
   depositing a second layer, said second layer having an average thickness of at least 25 nm and containing at least one refractory carbide; and
   depositing a third layer, said third layer having an average thickness of at least 25 nm and containing at least one refractory carbide,
   wherein:
   the second layer is sandwiched between the first layer and the third layer,
   the first layer has a larger mean linear intercept section grain size than the second layer,
   the third layer has a larger mean linear intercept section grain size than the second layer, and
   the second layer contains more of a non-carbon constituent of the refractory carbide than the first layer.

10. The CVD method according to claim 9, wherein the second layer containing more of the non-carbon constituent of the refractory carbide than the first layer is deposited under conditions different from conditions under which the second layer is deposited, and the conditions differ by:
   atmosphere composition,
   pressure, and/or
   temperature of the CVD coating atmosphere.

11. A method of coating to increase a lifetime of a support in an etching gas containing atmosphere and/or when exposed to mechanical stress, comprising coating the support with the refractory carbide multilayer according to claim 1.

12. A support comprising a coating of the refractory carbide multilayer according to claim 1, wherein coating provides the support with an increased lifetime in an etching gas containing atmosphere and/or when exposed to mechanical stress.

* * * * *